US012389565B2

(12) United States Patent
 Wang (10) Patent No.: US 12,389,565 B2
(45) Date of Patent: Aug. 12, 2025

(54) SLIDABLY PLUGGABLE MULTI-FAN MODULE AND SERVER COMPRISING SAME (71) Applicant: Suzhou MetaBrain Intelligent Technology Co., Ltd., Jiangsu (CN)

(72) Inventor: Yuxi Wang, Jiangsu (CN)

(73) Assignee: Suzhou MetaBrain Intelligent Technology Co., Ltd., Jiangsu (CN)

( * ) Notice: Subject to any disclaimer, the term of this patent is extended or adjusted under 35 U.S.C. 154(b) by 0 days.

(21) Appl. No.: 18/865,354

(22) PCT Filed: Aug. 17, 2023

(86) PCT No.: PCT/CN2023/113584
 § 371 (c)(1),
 (2) Date: Nov. 13, 2024

(87) PCT Pub. No.: WO2024/119880
 PCT Pub. Date: Jun. 13, 2024

(65) Prior Publication Data
 US 2025/0169025 A1 May 22, 2025

(30) Foreign Application Priority Data
 Dec. 5, 2022 (CN) .......................... 202211550256.0

(51) Int. Cl.
 *H05K 7/20* (2006.01)
 *F04D 25/16* (2006.01)
 (Continued)

(52) U.S. Cl.
 CPC ....... *H05K 7/20172* (2013.01); *F04D 25/166* (2013.01); *F04D 27/00* (2013.01); *F04D 29/646* (2013.01); *H05K 7/20736* (2013.01)

(58) Field of Classification Search
 CPC ...... F04D 25/166; F04D 27/00; F04D 29/646; H05K 7/20172; H05K 7/20736
 See application file for complete search history.

(56) References Cited

U.S. PATENT DOCUMENTS 7,558,061 B2 * 7/2009 Franz .................... F04D 29/646
 415/213.1
9,661,787 B2 * 5/2017 Hall .................... H05K 7/20727
(Continued)

FOREIGN PATENT DOCUMENTS

| CN | 108980078 A | 12/2018 |
| CN | 108983928 A | 12/2018 |

(Continued)

OTHER PUBLICATIONS

International Search Report of corresponding PCT application (PCT/CN2023/113584) Nov. 15, 2023, 8 pages.
(Continued)

*Primary Examiner* — Nathaniel E Wiehe
*Assistant Examiner* — Jason G Davis
(74) *Attorney, Agent, or Firm* — Cooper Legal Group, LLC (57) ABSTRACT

A slidably pluggable multi-fan module comprises: an outer fan module frame, a sliding rail, a chain bracket, a plurality of fans, and a push-pull frame. The outer fan module frame includes a bottom plate; the sliding rail is arranged on the bottom plate of the outer fan module frame; the chain bracket is composed of a plurality of fan brackets hinged to each other; a limiting rod matched with the sliding rail is arranged at a bottom of each fan bracket and slidable along the sliding rail; and one end of the push-pull frame is hinged to a fan bracket. The outer fan module frame of the slidably pluggable multi-fan module supports front panel maintenance; the chain bracket forms an opening and closing structure; and a bottom of the chain bracket cooperates with (Continued)

the sliding rail to achieve the design of a movement trajectory of the fans.

17 Claims, 3 Drawing Sheets

(51) Int. Cl.
*F04D 27/00* (2006.01)
*F04D 29/64* (2006.01)

(56) References Cited

U.S. PATENT DOCUMENTS

| | | | |
|---|---|---|---|
| 10,349,559 B2 * | 7/2019 | Trumbo | F04D 25/0693 |
| 11,096,314 B2 * | 8/2021 | Gupta | H05K 7/20172 |
| 2005/0254210 A1 | 11/2005 | Grady et al. | |
| 2013/0216365 A1 * | 8/2013 | Dalgaard | F04D 29/58 |
| | | | 415/182.1 |
| 2015/0216069 A1 * | 7/2015 | Hori | H05K 7/20727 |
| | | | 361/679.48 |
| 2019/0075677 A1 | 3/2019 | Ehlen | |

FOREIGN PATENT DOCUMENTS

| | | |
|---|---|---|
| CN | 210515136 U | 5/2020 |
| CN | 213306046 U | 5/2021 |
| CN | 214011892 U | 8/2021 |
| CN | 113530876 A | 10/2021 |
| CN | 216873600 U | 7/2022 |
| CN | 115562447 A | 1/2023 |
| CN | 218242491 U | 1/2023 |

OTHER PUBLICATIONS

Written Opinion of International Searching Authority of corresponding PCT application (PCT/CN2023/113584) Nov. 15, 2023, 8 pages.
First CN Office Action of corresponding CN priority application (CN202211550256.0) Jan. 11, 2023, 10 pages.
Notification to Grant Patent Right for Invention of corresponding CN priority application (CN202211550256.0) Nov. 16, 2023, 3 pages.

* cited by examiner

SLIDABLY PLUGGABLE MULTI-FAN MODULE AND SERVER COMPRISING SAME

CROSS-REFERENCE TO RELATED APPLICATIONS

This application claims priority to Chinese Patent Application No. 202211550256.0, filed on Dec. 5, 2022, in China National Intellectual Property Administration and entitled "SLIDABLY PLUGGABLE MULTI-FAN MODULE AND SERVER COMPRISING SAME", which is hereby incorporated by reference in its entirety.

FIELD

The present application relates to the technical field of slidably pluggable multi-fan modules, and in particular, to a slidably pluggable multi-fan module and a server comprising same.

BACKGROUND

In a traditional data center room, fans are the only cooling component and crucial for the stable operation of servers. There are three arrangement modes for a fan wall of a rack server: front arrangement, middle arrangement, and rear arrangement. The front and middle-mounted fans can achieve thermal maintenance, which means that the fans can be directly plugged for maintenance without changing a state of a case. However, most cases use an architecture design with middle-mounted fans to meet close storage and computation requirements. During maintenance of the middle-mounted fans, the case needs to be pulled out or removed from a guiding rail before an upper cover is opened to repair or replace the fans. In addition, some types of servers and guiding rails do not support thermal maintenance, and faults of the fans will be handled only after the power is cut off. These problems can lead to long maintenance time and affect the service efficiency of a data center. Therefore, for mainstream middle-mounted fan architecture servers, a thermal maintenance fan module that can be directly obtained from a front/rear panel is required.

In the design of a general-purpose rack server, most fans do not support front and rear panel maintenance in a middle-mounted fan architecture. Among publicly available products or technologies, SR950 is one of a few of fans that can support front-end maintenance. However, it only supports independent plugging and unplugging of a single fan, but cannot support plugging and unplugging of an entire fan module. During maintenance of a batch of fans, it is cumbersome to operate the fans one by one.

SUMMARY

Based on this, for the above technical problems, it is necessary to provide a slidably pluggable multi-fan module and a server comprising same, to improve the maintenance efficiency of an entire fan module and reduce the cost of a fan module bracket.

According to a first aspect, a slidably pluggable multi-fan module is provided. The slidably pluggable multi-fan module comprises:

an outer fan module frame, including a bottom plate, wherein a push-pull guiding region and a fan mounting region are arranged on the bottom plate;

a sliding rail, arranged on the bottom plate of the outer fan module frame;

a chain bracket, composed of a plurality of fan brackets hinged to each other, wherein a limiting rod matched with the sliding rail is arranged at a bottom of each fan bracket and slidable along the sliding rail; a length of the chain bracket is equal to a length of the fan mounting region;

a plurality of fans, wherein each fan is correspondingly arranged in corresponding one of the plurality of fan brackets; and a push-pull frame, wherein a first end of the push-pull frame is hinged to one of the plurality of fan brackets at an end portion of the chain bracket; and the push-pull frame can push the chain bracket from the push-pull guiding region into the fan mounting region along the sliding rail and then fixes the chain bracket, and can pull the chain bracket out of the fan mounting region along the sliding rail to the push-pull guiding region or to be beyond the sliding rail.

In an embodiment, the bottom plate is L-shaped; an extension direction of the push-pull guiding region and an extension direction of the fan mounting region are perpendicularly arranged; and the sliding rail is L-shaped and is arranged in a middle part of the bottom plate.

In an embodiment, inner sides of connection positions of the push-pull guiding region and the fan mounting region are connected in an arc-shaped smooth transition manner; and portions, corresponding to the connection positions of the push-pull guiding region and the fan mounting region, of the sliding rail are arc-shaped.

In an embodiment, each fan bracket comprises:

a sliding plate, wherein at least two groups of the limiting rods are arranged at a bottom of the sliding plate;

a hinge plate, perpendicularly connected to the sliding plate, wherein the hinge plate is provided with a first side edge and a second side edge;

a first hinge structure, arranged at the first side edge of the hinge plate; and a second hinge structure, arranged at the second side edge of the hinge plate, wherein the first hinge structures of any two adjacent fan brackets are in hinge connection to the second hinge structures.

In an embodiment, the first hinge structure comprises:

a groove, arranged in a middle part of the first side edge of the hinge plate; and two C-shaped elements, arranged on the first side edge of the hinge plate and respectively located above and below the groove.

In an embodiment, the second hinge structure comprises:

a convex block, arranged in a middle part of the second side edge of the hinge plate; and two rotating shafts, respectively connected above and below the convex block.

In an embodiment, the push-pull frame is provided with a first hinge structure hinged to the second hinge structure on the fan bracket at the corresponding end portion of the chain bracket.

In an embodiment, the push-pull frame is provided with a second hinge structure hinged to the first hinge structure on the fan bracket at the corresponding end portion of the chain bracket.

In an embodiment, each fan bracket further comprises: a barrier plate, perpendicularly connected to the sliding plate and arranged in parallel to the hinge plate, wherein both the barrier plate and the hinge plate are provided with fixing holes configured to fix the fan.

In an embodiment, the outer fan module frame further comprises an outer side plate perpendicular to the bottom plate; the outer side plate extends from the push-pull guiding region to the fan mounting region; and the outer side plate is arranged in parallel to the push-pull frame.

In an embodiment, the slidably pluggable multi-fan module further comprises:
- a fan control panel, arranged on the outer side plate and corresponding to the fan mounting region; and
- a fan management board, arranged at an end portion of the push-pull frame adjacent to the fan brackets, wherein the fan management board corresponds to the fan control panel; and under a circumstance that the chain bracket is fixed in the fan mounting region, the fan management board is correspondingly connected to the fan control panel.

In an embodiment, the fan control panel is electrically connected to a control chip of a server; the fan control panel is electrically connected to the fan; and the fan management board is configured to control communication between the fan control panel and the fans.

In an embodiment, the fan control panel is provided with a terminal; the fan management board is provided with a connector; the fans are provided with cable connectors; and the cable connectors of the fans are plugged into the terminal of the fan control panel.

In an embodiment, under a circumstance that the chain bracket is fixed in the fan mounting region, the connector of the fan management board is plugged into the terminal of the fan control panel to receive a signal of the fan management board; and the fan control panel sends an in-place signal of the fans to the control chip of the server, otherwise, the fan control panel sends an absence signal of the fans to the control chip of the server.

In an embodiment, a length of the push-pull frame is equal to a length of the push-pull guiding region; and the push-pull frame further comprises a handle at one end away from the fan brackets.

In an embodiment, the push-pull frame further comprises a stop lock at one end away from the fan brackets, and the stop lock can be locked with the outer fan module frame.

In an embodiment, the outer fan module frame further comprises an inner side plate perpendicular to the bottom plate; a stop slot is provided on the inner side plate; and the stop lock can be hooked and locked with the stop slot.

In an embodiment, the stop lock is further provided with an unlock button beyond the inner side plate, and the unlock button is arranged above the handle.

According to a second aspect, a server is provided. The server comprises the foregoing slidably pluggable multi-fan module.

In an embodiment, the server is further provided with a control chip; the fan control panel of the slidably pluggable multi-fan module is electrically connected to the control chip; and the control chip comprises a baseboard management controller.

According to the above slidably pluggable multi-fan module and the server comprising same, the outer fan module frame supports the maintenance of a front panel, namely, a module in which a plurality of fans are integrated is directly plugged into a middle fan position of a case from the front panel; the chain bracket forms a hinge structure in the form of a chain; and a bottom of the chain bracket cooperates with the sliding rail to achieve the design of a fan movement trajectory.

BRIEF DESCRIPTION OF THE DRAWINGS

For clearer descriptions of the technical solutions according to the embodiments of the present application, the drawings required to be used in the description of the embodiments are briefly introduced below. It is obvious that the drawings in the description below are only some embodiments of the present application, and it is obvious for those skilled in the art that other drawings can be acquired according to the drawings without creative efforts.

REFERENCE NUMERALS

1: outer fan module frame; 11: bottom plate; 111: push-pull guiding region; 112: fan mounting region; 12: inner side plate; 121: stop slot; 13: outer side plate; 2: sliding rail; 3: chain bracket; 31: fan bracket; 311: sliding plate; 312: hinge plate; 313: barrier plate; 314: fixing hole; 32: limiting rod; 33: first hinge structure; 331: groove; 332: C-shaped element; 34: second hinge structure; 341: rotating shaft; 342: convex block; 4: fan; 5: push-pull frame; 51: handle; 52: stop lock; 53: unlock button; 54: C-shaped element; 6: fan control panel; 61: terminal; 7: fan management board; and 71: connector.

DETAILED DESCRIPTION

In order to make the objectives, technical solutions, and advantages of the present application clearer, the following is a further detailed explanation of the present application in conjunction with the accompanying drawings and embodiments. It should be understood that the detailed embodiments described here are only intended to explain the present application and are not intended to limit the present application.

As mentioned in the background, all middle-mounted fan modules used can be only accessed and maintained after upper covers are opened. For most fans that do not support front and rear panel maintenance, the entire fan module cannot be plugged and unplugged. During maintenance of a batch of fans, it is cumbersome to operate the fans one by one.

Aspect 1

To solve the above problems, Aspect 1 of the present application innovatively provides a slidably pluggable multi-fan module. The slidably pluggable multi-fan module has a height of 73.8 mm, and a single fan 4 has an outline dimension of 60 mm×60 mm×56 mm, which is suitable for being placed in a standard 2U server case, or a plurality of slidably pluggable multi-fan modules are combined and placed in a server case of 4U or above. The slidably pluggable multi-fan module is composed of an outer fan module frame 1, a sliding rail 2, a chain bracket 3 formed by hinging six fan brackets 31, six fans 4, a push-pull frame 5 with a handle 51 and a stop lock 52, a fan control panel 6, and a fan management board 7.

A main function of the outer fan module frame 1 is supporting and positioning. A bottom plate 11 of the outer fan module frame is correspondingly provided with an L-shaped, convex hull structure serving as the sliding rail 2 for the fans 4. In conjunction with limiting rods 32 at bottoms of the fan brackets 31, it can ensure that the fans 4 slide along the sliding rail 2 into a case.

Figure 3:
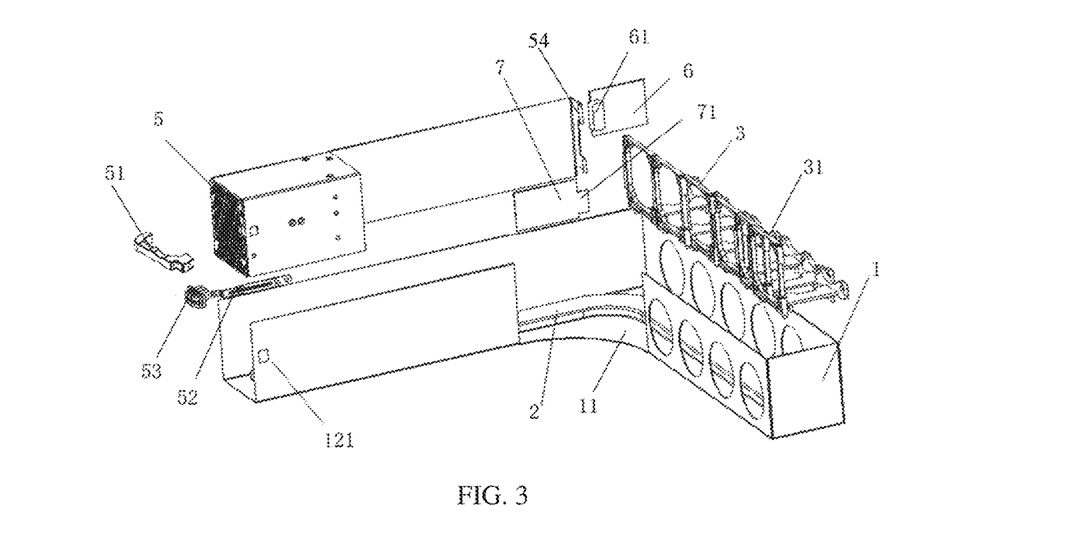
FIG. 3 is a partially structural exploded diagram of a slidably pluggable multi-fan module in an embodiment.

As shown in FIG. 3, a C-shaped element 54 of the push-pull frame 5 hooks the outermost fan bracket 31, and its main function is to drive the six fans 4 connected into a "small train" to slide along the rail 2. The handle 51 is mounted on an outer side of the push-pull frame 5, making it easy for a user to hold. The stop lock 52 is mounted on a side surface of the handle 51. When the fans 4 slide in place, the stop lock 52 may hook and lock a stop slot 121 of the outer frame, ensuring that the chain bracket 3 formed by hinging the fan brackets 31 is fixed. In addition, a button on the handle 51 can unlock the stop lock 52 using the lever principle, thus pulling the fans 4 out in a small-train manner for maintenance.

Figure 5:
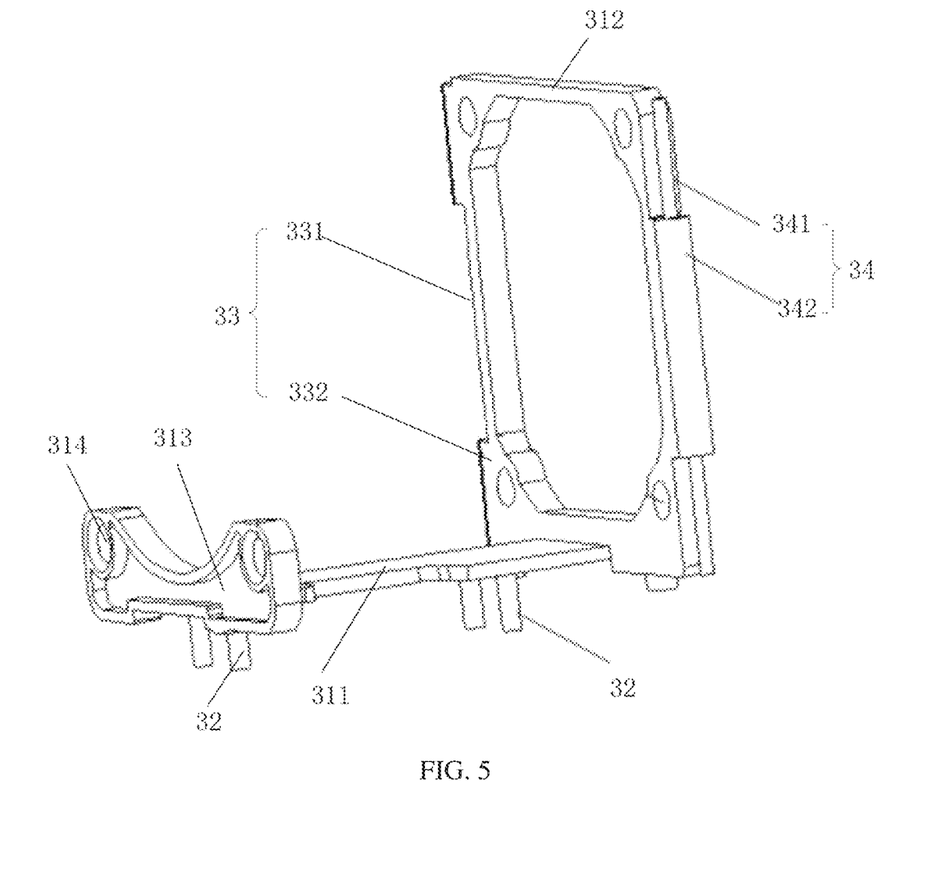
FIG. 5 is a schematic structural diagram of a fan bracket in an embodiment.

The C-shaped element 54 is formed by bending a sheet metal and can be assembled with a rotating shaft 341 in FIG. 5, thus being connected to the fan brackets 31.

The function of the fan management board 7 is to achieve communication between the fan control panel 6 and the fans 4, and the function of the fan control panel 6 is to communicate with an upstream control chip. The control chip includes a baseboard management controller (BMC). After the push-pull frame 5 is mounted in place, a connector 71 on an inner side of the management board may be plugged into a terminal 61 on an outer side of the control panel. The control panel can receive a signal from the management board and send a message "Fans 4 are in place" to the upstream control chip inside the server. On the contrary, when the fan management board 7 is pulled out, the control panel may send a message "Fans 4 are not in place" to the upstream. Cable connectors 71 of the fans 4 can be plugged into the terminal 61 on the management board to achieve communication between the fans 4 and the management board (the cables are not shown in the figure).

The cooperation between the fan management board 7 and the fan control panel 6 can achieve conventional control of the fans 4 and determine a presence state of the fan module. The combined function of the fan control panel 6 and the fan management board 7 include reminding presence/absence of the fans 4 and controlling the fans 4.

Figure 6:
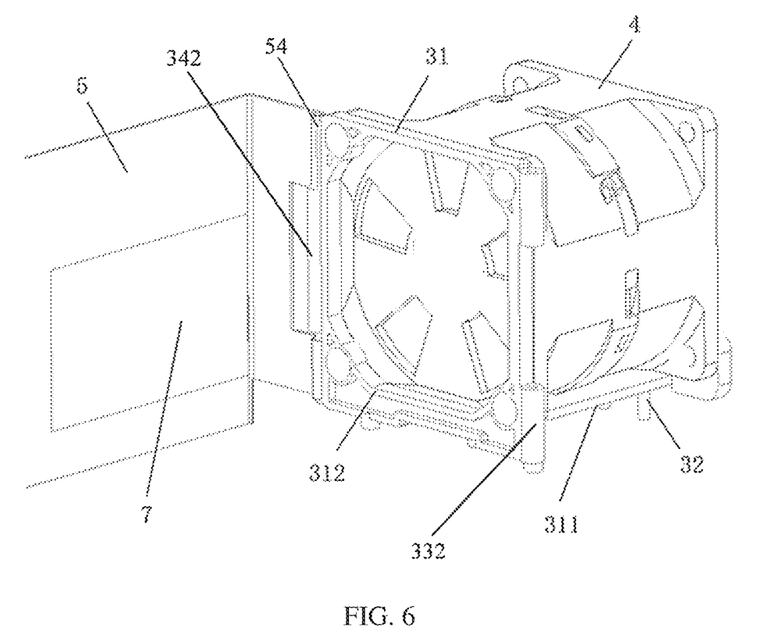
FIG. 6 is a schematic structural diagram of a fan bracket hinged to a push-pull frame in an embodiment.

As shown in FIG. 6, the six fan brackets 31 have identical appearances and are connected to the fans 4 through six screws. Four guiding rail limiting rods 32 are arranged at the bottom, and a distance between the limiting rods 32 is consistent with or increases by about 10% relative to a width of the sliding rail 2 on the bottom plate 11 of the outer fan module frame 1. A groove 331 of a first hinge structure 33 on a left side of each fan bracket 31 and a convex block 342 of a second hinge structure 34 on a right side have the same widths. When two or more fan brackets 31 are connected to each other, rotating shafts 341 are used to penetrate through the C-shaped elements 332 on the two sides to form an opening and closing structure. When the chain bracket 3 formed by hinging the fan brackets 31 turns, the opening and closing structure provides a degree of freedom of rotation.
Aspect 2

Figure 1:
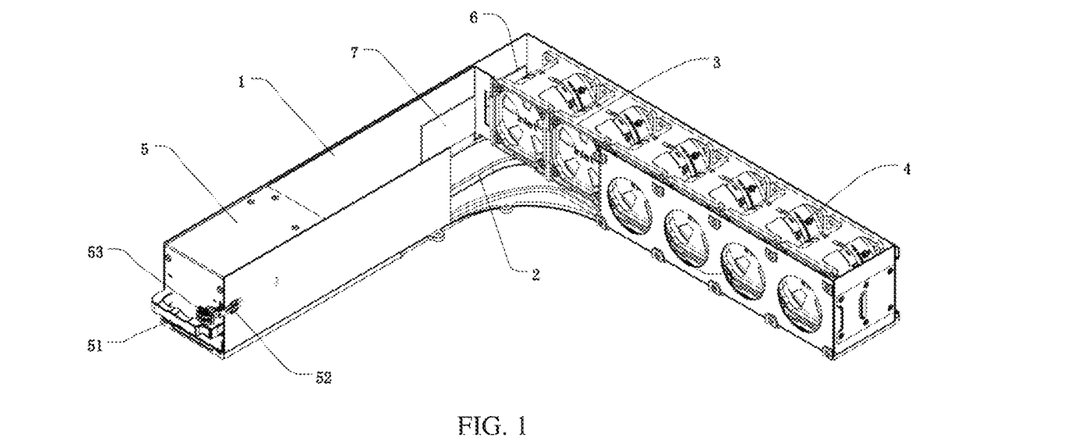
FIG. 1 is a schematic diagram of a three-dimensional structure of a slidably pluggable multi-fan module in an embodiment.
Figure 2:
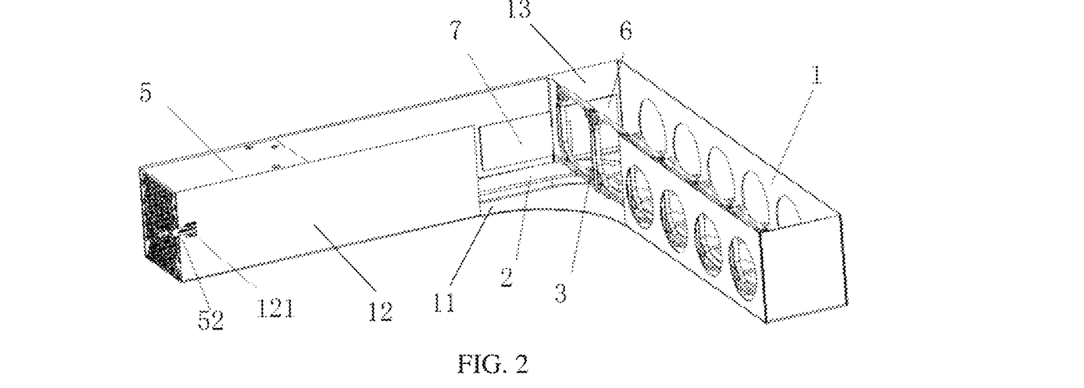
FIG. 2 is a partially structural diagram of a slidably pluggable multi-fan module in an embodiment.

In Aspect 2, as shown in FIG. 2, a slidably pluggable multi-fan module is provided, including: an outer fan module frame 1, a sliding rail 2, a chain bracket 3, a plurality of fans 4, and a push-pull frame 5.

Figure 7:
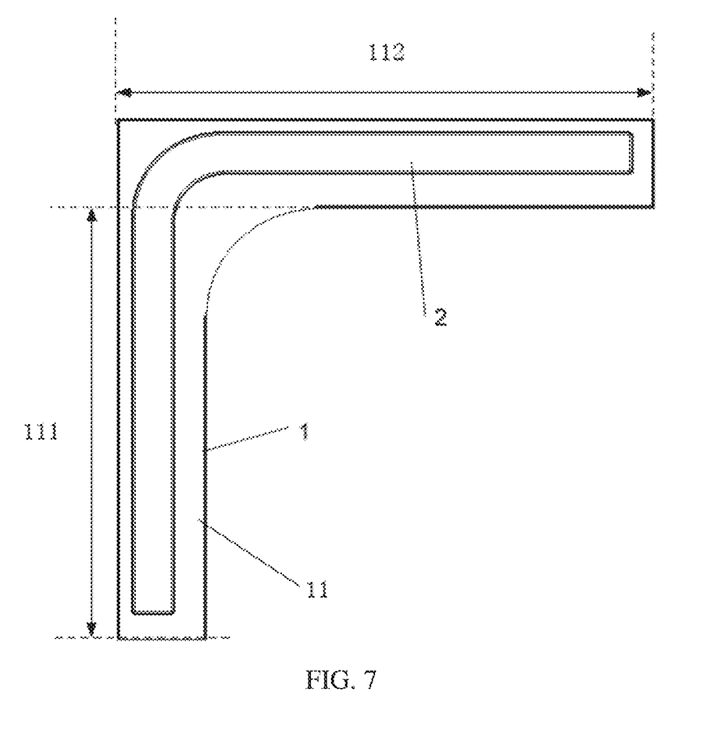
FIG. 7 is a schematic structural diagram of an outer fan module frame in an embodiment.

As shown in FIG. 2, FIG. 3, and FIG. 7, the outer fan module frame 1 includes an L-shaped bottom plate 11; the bottom plate 11 is provided with a push-pull guiding region 111 and a fan mounting region 112; the sliding rail 2 is arranged on the bottom plate 11 of the outer fan module frame 1 in an L-shaped manner; the chain bracket 3 is composed of a plurality of fan brackets 31 hinged to each other; a limiting rod 32 matched with the sliding rail 2 is arranged at a bottom of each fan bracket 31 and can slide along the sliding rail 2; a length of the chain bracket 3 is equal to a length of the fan mounting region 112; each fan 4 is correspondingly arranged in one fan bracket 31; one end of the push-pull frame 5 is hinged to a fan bracket 31 at an end portion of the chain bracket 3; and the push-pull frame 5 can push the chain bracket 3 from the push-pull guiding region 111 into the fan mounting region 112 along the sliding rail 2 and then fixes the chain bracket, and can pull the chain bracket 3 out of the fan mounting region 112 along the sliding rail 2 to the push-pull guiding region 111 or to be beyond the sliding rail 2.

Inner sides of connection positions of the push-pull guiding region 111 and the fan mounting region 112 are connected in an arc-shaped smooth transition manner; and portions, corresponding to the connection positions of the push-pull guiding region 111 and the fan mounting region 112, of the sliding rail 2 are arc-shaped. The sliding rail 2 is arranged in a middle part of the bottom plate 11 in the L-shaped manner. Due to this arrangement, it is convenient to push the chain bracket 3 from the push-pull guiding region 111 into the fan mounting region 112 along the sliding rail 2.

As shown in FIG. 7, a main function of the outer fan module frame 1 is supporting and positioning. The bottom plate 11 of the outer fan module frame is correspondingly provided with an L-shaped convex hull structure serving as the sliding rail 2 for the fans 4. In conjunction with the limiting rods 32 at the bottoms of the fan brackets 31, it can ensure that the fans 4 slide along the sliding rail 2 into a case.

In this aspect, a length of the push-pull frame 5 is equal to a length of the push-pull guiding region 111.

In this aspect, as shown in FIG. 2, FIG. 3, and FIG. 7, the outer fan module frame 1 further includes an inner side plate 12 and an outer side plate 13 which are perpendicular to the bottom plate 11. The outer side plate 13 is arranged in parallel to the inner side plate 12, and the outer side plate 13 extends from the push-pull guiding region 111 to the fan mounting region 112. The outer side plate 13 is arranged in parallel to the push-pull frame 5.

As shown in FIG. 2 and FIG. 3, the slidably pluggable multi-fan module further includes: a fan control panel 6 and a fan management board 7. The fan control panel 6 is arranged on the outer side plate 13 and corresponds to the fan mounting region 112. The fan management board 7 is arranged at an end portion of the push-pull frame 5 adjacent to the fan brackets 31. The fan management board 7 corresponds to the fan control panel 6; and when the chain bracket 3 is fixed in the fan mounting region 112, the fan management board 7 is correspondingly connected to the fan control panel 6.

In this aspect, as shown in FIG. 2 and FIG. 3, the fan control panel 6 is electrically connected to a control chip of a server. The control chip includes a baseboard management controller (BMC). The fan control panel 6 is electrically connected to the fans 4, and the fan management board 7 is configured to control communication between the fan control panel 6 and the fans 4.

The fan control panel 6 is provided with a terminal 61; the fan management board 7 is provided with a connector 71; the fans 4 are provided with cable connectors 71; and the cable connectors 71 of the fans 4 are plugged into the terminal 61 of the fan control panel 6. When the chain bracket 3 is fixed in the fan mounting region 112, the connector 71 of the fan management board 7 is plugged into the terminal 61 of the fan control panel 6 to receive a signal of the fan management board 7; and the fan control panel 6 sends an in-place signal of the fans 4 to the control chip of the server, otherwise, the fan control panel 6 sends an absence signal of the fans 4 to the control chip of the server.

The cooperation between the fan management board 7 and the fan control panel 6 can achieve conventional control of the fans 4 and determine an in-place state of the fan module. The combined function of the fan control panel 6 and the fan management board 7 include reminding in-place/absence of the fans 4 and controlling the fans 4.

In this aspect, as shown in FIG. 3 and FIG. 5, each fan bracket 31 includes a sliding plate 311, a hinge plate 312, a first hinge structure 33, and a second hinge structure 34. At least two groups of the limiting rods 32 are arranged at a bottom of the sliding plate 311; the hinge plate 312 is perpendicularly connected to the sliding plate 311; the hinge plate 312 is provided with a first side edge and a second side edge; the first hinge structure 33 is arranged at the first side edge of the hinge plate 312; and the second hinge structure 34 is arranged at the second side edge of the hinge plate 312. The first hinge structures 33 of any two adjacent fan brackets 31 can be in hinge connection to the second hinge structures 34.

In this aspect, as shown in FIG. 5, the first hinge structure 33 includes: a groove 331, arranged in a middle part of the first side edge of the hinge plate 312; and two C-shaped elements 332, arranged on the first side edge of the hinge plate 312 and respectively located above and below the groove 331.

As shown in FIG. 5, the second hinge structure 34 includes: a convex block 342, arranged in a middle part of the second side edge of the hinge plate 312; and two rotating shafts 341, respectively connected above and below the convex block 342.

As shown in FIG. 5, each fan bracket 31 further includes: a barrier plate 313. The barrier plate 313 is perpendicularly connected to the sliding plate 311 and arranged in parallel to the hinge plate 312. Both the barrier plate 313 and the hinge plate 312 are provided with fixing holes 314 configured to fix the fan 4.

Figure 4:
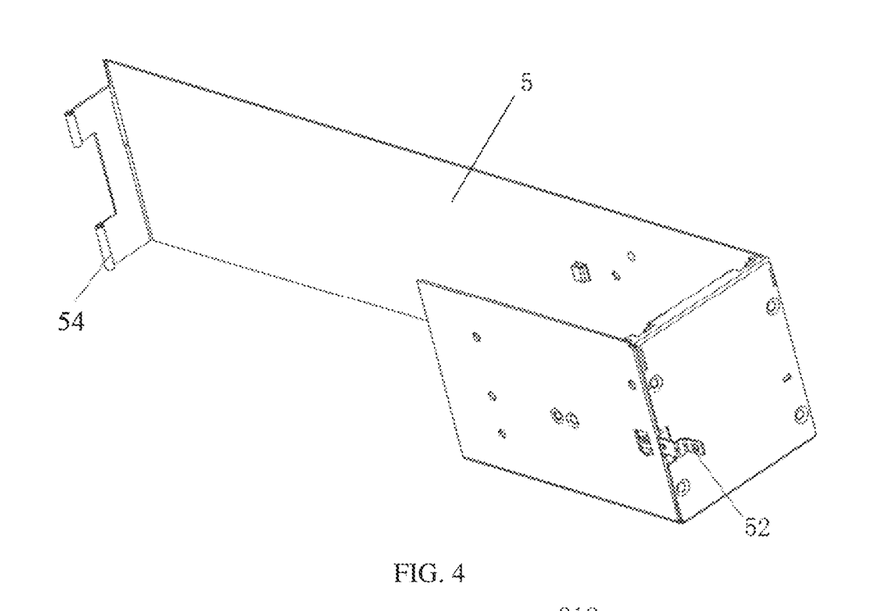
FIG. 4 is a schematic structural diagram of a push-pull frame in an embodiment.

In this aspect, as shown in FIG. 3 and FIG. 4, the push-pull frame 5 is provided with a first hinge structure 33 hinged to the second hinge structure 34 on the fan bracket 31 at the corresponding end portion of the chain bracket 3. Or alternatively, the push-pull frame 5 is provided with a second hinge structure 34 hinged to the first hinge structure 33 on the fan bracket 31 at the corresponding end portion of the chain bracket 3.

As shown in FIG. 6, the six fan brackets 31 have identical appearances and are connected to the fans 4 through six screws. Four guiding rail limiting rods 32 are arranged at the bottom, and a distance between the limiting rods 32 is consistent with or increases by about 10% relative to a width of the sliding rail 2 on the bottom plate 11 of the outer fan module frame 1. The groove 331 of the first hinge structure 33 on the left side of each fan bracket 31 and the convex block 342 of the second hinge structure 34 on the right side have the same widths. When two or more fan brackets 31 are connected to each other, the rotating shafts 341 are used to penetrate through the C-shaped elements 332 on the two sides to form an opening and closing structure. When the chain bracket 3 formed by hinging the fan brackets 31 turns, the opening and closing structure provides a degree of freedom of rotation.

Aspect 3

In Aspect 3, as shown in FIG. 2, a slidably pluggable multi-fan module is provided, including: an outer fan module frame 1, a sliding rail 2, a chain bracket 3, a plurality of fans 4, and a push-pull frame 5.

As shown in FIG. 2, FIG. 3, and FIG. 7, the outer fan module frame 1 includes an L-shaped bottom plate 11; the bottom plate 11 is provided with a push-pull guiding region 111 and a fan mounting region 112; the sliding rail 2 is arranged on the bottom plate 11 of the outer fan module frame 1 in an L-shaped manner; the chain bracket 3 is composed of a plurality of fan brackets 31 hinged to each other; a limiting rod 32 matched with the sliding rail 2 is arranged at a bottom of each fan bracket 31 and can slide along the sliding rail 2; a length of the chain bracket 3 is equal to a length of the fan mounting region 112; each fan 4 is correspondingly arranged in one fan bracket 31; one end of the push-pull frame 5 is hinged to a fan bracket 31 at an end portion of the chain bracket 3; and the push-pull frame 5 can push the chain bracket 3 from the push-pull guiding region 111 into the fan mounting region 112 along the sliding rail 2 and then fixes the chain bracket, and can pull the chain bracket 3 out of the fan mounting region 112 along the sliding rail 2 to the push-pull guiding region 111 or to be beyond the sliding rail 2.

Inner sides of connection positions of the push-pull guiding region 111 and the fan mounting region 112 are connected in an arc-shaped smooth transition manner; and portions, corresponding to the connection positions of the push-pull guiding region 111 and the fan mounting region 112, of the sliding rail 2 are arc-shaped. The sliding rail 2 is arranged in a middle part of the bottom plate 11 in the L-shaped manner. Due to this arrangement, it is convenient to push the chain bracket 3 from the push-pull guiding region 111 into the fan mounting region 112 along the sliding rail 2.

As shown in FIG. 7, a main function of the outer fan module frame 1 is supporting and positioning. The bottom plate 11 of the outer fan module frame is correspondingly provided with an L-shaped convex hull structure serving as the sliding rail 2 for the fans 4. In conjunction with the limiting rods 32 at the bottoms of the fan brackets 31, it can ensure that the fans 4 slide along the sliding rail 2 into a case.

In this aspect, a length of the push-pull frame 5 is equal to a length of the push-pull guiding region 111; and the push-pull frame 5 further includes a handle 51 at one end away from the fan brackets 31.

In this aspect, the push-pull frame 5 further includes a stop lock 52 at one end away from the fan brackets 31, and the stop lock 52 can be locked with the outer fan module frame 1.

In an embodiment, as shown in FIG. 2 and FIG. 3, the outer fan module frame 1 further includes an inner side plate 12 perpendicular to the bottom plate 11; a stop slot 121 is provided on the inner side plate 12; and the stop lock 52 can be hooked and locked with the stop slot 121. The stop lock 52 is further provided with an unlock button 53 beyond the inner side plate 12, and the unlock button 53 is arranged above the handle 51.

In this aspect, as shown in FIG. 2, FIG. 3, and FIG. 7, the outer fan module frame 1 further includes an outer side plate 13 perpendicular to the bottom plate 11. The outer side plate 13 is arranged in parallel to the inner side plate 12, and the outer side plate 13 extends from the push-pull guiding region 111 to the fan mounting region 112. The outer side plate 13 is arranged in parallel to the push-pull frame 5.

As shown in FIG. 2 and FIG. 3, the slidably pluggable multi-fan module further includes: a fan control panel 6, arranged on the outer side plate 13 and corresponding to the fan mounting region 112; and a fan management board 7, arranged at an end portion of the push-pull frame 5 adjacent to the fan brackets 31. The fan management board 7 corresponds to the fan control panel 6; and when the chain bracket 3 is fixed in the fan mounting region 112, the fan management board 7 is correspondingly connected to the fan control panel 6.

In this aspect, as shown in FIG. 2 and FIG. 3, the fan control panel 6 is electrically connected to a control chip of a server. The control chip includes a BMC. The fan control panel 6 is electrically connected to the fans 4, and the fan management board 7 is configured to control communication between the fan control panel 6 and the fans 4.

The fan control panel 6 is provided with a terminal 61; the fan management board 7 is provided with a connector 71; the fans 4 are provided with cable connectors 71; and the cable connectors 71 of the fans 4 are plugged into the terminal 61 of the fan control panel 6. When the chain bracket 3 is fixed in the fan mounting region 112, the connector 71 of the fan management board 7 is plugged into the terminal 61 of the fan control panel 6 to receive a signal of the fan management board 7; and the fan control panel 6 sends an in-place signal of the fans 4 to the control chip of the server, otherwise, the fan control panel 6 sends an absence signal of the fans 4 to the control chip of the server.

The cooperation between the fan management board 7 and the fan control panel 6 can achieve conventional control of the fans 4 and determine an in-place state of the fan module. The combined function of the fan control panel 6 and the fan management board 7 include reminding in-place/absence of the fans 4 and controlling the fans 4. In this aspect, as shown in FIG. 3 and FIG. 5, each fan bracket 31 includes a sliding plate 311, a hinge plate 312, a first hinge structure 33, and a second hinge structure 34. At least two groups of the limiting rods 32 are arranged at a bottom of the sliding plate 311; the hinge plate 312 is perpendicularly connected to the sliding plate 311; the hinge plate 312 is provided with a first side edge and a second side edge; the first hinge structure 33 is arranged at the first side edge of the hinge plate 312; and the second hinge structure 34 is arranged at the second side edge of the hinge plate 312. The first hinge structures 33 of any two adjacent fan brackets 31 can be in hinge connection to the second hinge structures 34.

In this aspect, as shown in FIG. 5, the first hinge structure 33 includes: a groove 331, arranged in a middle part of the first side edge of the hinge plate 312; and two C-shaped elements 332, arranged on the first side edge of the hinge plate 312 and respectively located above and below the groove 331.

As shown in FIG. 5, the second hinge structure 34 includes: a convex block 342, arranged in a middle part of the second side edge of the hinge plate 312; and two rotating shafts 341, respectively connected above and below the convex block 342.

As shown in FIG. 5, each fan bracket 31 further includes: a barrier plate 313. The barrier plate 313 is perpendicularly connected to the sliding plate 311 and arranged in parallel to the hinge plate 312. Both the barrier plate 313 and the hinge plate 312 are provided with fixing holes 314 configured to fix the fan 4.

In this aspect, as shown in FIG. 3 and FIG. 4, the push-pull frame 5 is provided with a first hinge structure 33 hinged to the second hinge structure 34 on the fan bracket 31 at the corresponding end portion of the chain bracket 3. Or alternatively, the push-pull frame 5 is provided with a second hinge structure 34 hinged to the first hinge structure 33 on the fan bracket 31 at the corresponding end portion of the chain bracket 3.

The outer fan module frame 1 in the above slidably pluggable multi-fan module supports front panel maintenance, namely, a module in which a plurality of fans 4 are integrated is directly plugged into a middle arrangement position for the fans 4 of a case from a front panel; the chain bracket 3 forms an opening and closing structure in the form of a chain; and the bottom of the chain bracket cooperates with the sliding rail 2 to achieve the design of a movement trajectory of the fans 4.

As shown in FIG. 6, the six fan brackets 31 have identical appearances and are connected to the fans 4 through six screws. Four guiding rail limiting rods 32 are arranged at the bottom, and a distance between the limiting rods 32 is consistent with or increases by about 10% relative to a width of the sliding rail 2 on the bottom plate 11 of the outer fan module frame 1. The groove 331 of the first hinge structure 33 on the left side of each fan bracket 31 and the convex block 342 of the second hinge structure 34 on the right side have the same widths. When two or more fan brackets 31 are connected to each other, the rotating shafts 341 are used to penetrate through the C-shaped elements 332 on the two sides to form an opening and closing structure. When the chain bracket 3 formed by hinging the fan brackets 31 turns, the opening and closing structure provides a degree of freedom of rotation.

Aspect 4

In this aspect, a server is provided, including a slidably pluggable multi-fan module. The slidably pluggable multi-fan module has a height of 73.8 mm, and a single fan 4 has an outline dimension of 60 mm×60 mm×56 mm, which is suitable for being placed in a standard 2U server case, or a plurality of slidably pluggable multi-fan modules are combined and placed in a server case of 4U or above. The server includes a control chip. The control chip is electrically connected to a fan control panel 6, and the control chip includes a BMC.

As shown in FIG. 2, a slidably pluggable multi-fan module is provided, including: an outer fan module frame 1, a sliding rail 2, a chain bracket 3, a plurality of fans 4, and a push-pull frame 5.

As shown in FIG. 2, FIG. 3, and FIG. 7, the outer fan module frame 1 includes an L-shaped bottom plate 11; the bottom plate 11 is provided with a push-pull guiding region 111 and a fan mounting region 112; the sliding rail 2 is arranged on the bottom plate 11 of the outer fan module frame 1 in an L-shaped manner; the chain bracket 3 is composed of a plurality of fan brackets 31 hinged to each other; a limiting rod 32 matched with the sliding rail 2 is arranged at a bottom of each fan bracket 31 and can slide along the sliding rail 2; a length of the chain bracket 3 is equal to a length of the fan mounting region 112; each fan 4 is correspondingly arranged in one fan bracket 31; one end of the push-pull frame 5 is hinged to a fan bracket 31 at an end portion of the chain bracket 3; and the push-pull frame 5 can push the chain bracket 3 from the push-pull guiding region 111 into the fan mounting region 112 along the sliding rail 2 and then fixes the chain bracket, and can pull the chain bracket 3 out of the fan mounting region 112 along the sliding rail 2 to the push-pull guiding region 111 or to be beyond the sliding rail 2.

Inner sides of connection positions of the push-pull guiding region 111 and the fan mounting region 112 are connected in an arc-shaped smooth transition manner; and portions, corresponding to the connection positions of the push-pull guiding region 111 and the fan mounting region 112, of the sliding rail 2 are arc-shaped. The sliding rail 2 is arranged in a middle part of the bottom plate 11 in the L-shaped manner. Due to this arrangement, it is convenient to push the chain bracket 3 from the push-pull guiding region 111 into the fan mounting region 112 along the sliding rail 2.

As shown in FIG. 7, a main function of the outer fan module frame 1 is supporting and positioning. The bottom plate 11 of the outer fan module frame is correspondingly provided with an L-shaped convex hull structure serving as the sliding rail 2 for the fans 4. In conjunction with the limiting rods 32 at the bottoms of the fan brackets 31, it can ensure that the fans 4 slide along the sliding rail 2 into a case.

In this aspect, a length of the push-pull frame 5 is equal to a length of the push-pull guiding region 111.

In this aspect, as shown in FIG. 2, FIG. 3, and FIG. 7, the outer fan module frame 1 further includes an inner side plate 12 and an outer side plate 13 which are perpendicular to the bottom plate 11. The outer side plate 13 is arranged in parallel to the inner side plate 12, and the outer side plate 13 extends from the push-pull guiding region 111 to the fan mounting region 112. The outer side plate 13 is arranged in parallel to the push-pull frame 5.

As shown in FIG. 2 and FIG. 3, the slidably pluggable multi-fan module further includes: a fan control panel 6 and a fan management board 7. The fan control panel 6 is arranged on the outer side plate 13 and corresponds to the fan mounting region 112. The fan management board 7 is arranged at an end portion of the push-pull frame 5 adjacent to the fan brackets 31. The fan management board 7 corresponds to the fan control panel 6; and when the chain bracket 3 is fixed in the fan mounting region 112, the fan management board 7 is correspondingly connected to the fan control panel 6.

In this aspect, as shown in FIG. 2 and FIG. 3, the fan control panel 6 is electrically connected to a control chip of a server. The control chip includes a BMC. The fan control panel 6 is electrically connected to the fans 4, and the fan management board 7 is configured to control communication between the fan control panel 6 and the fans 4.

The fan control panel 6 is provided with a terminal 61; the fan management board 7 is provided with a connector 71; the fans 4 are provided with cable connectors 71; and the cable connectors 71 of the fans 4 are plugged into the terminal 61 of the fan control panel 6. When the chain bracket 3 is fixed in the fan mounting region 112, the connector 71 of the fan management board 7 is plugged into the terminal 61 of the fan control panel 6 to receive a signal of the fan management board 7; and the fan control panel 6 sends an in-place signal of the fans 4 to the control chip of the server, otherwise, the fan control panel 6 sends an absence signal of the fans 4 to the control chip of the server.

The cooperation between the fan management board 7 and the fan control panel 6 can achieve conventional control of the fans 4 and determine an in-place state of the fan module. The combined function of the fan control panel 6 and the fan management board 7 include reminding in-place/absence of the fans 4 and controlling the fans 4.

In this aspect, as shown in FIG. 3 and FIG. 5, each fan bracket 31 includes a sliding plate 311, a hinge plate 312, a first hinge structure 33, and a second hinge structure 34. At least two groups of the limiting rods 32 are arranged at a bottom of the sliding plate 311; the hinge plate 312 is perpendicularly connected to the sliding plate 311; the hinge plate 312 is provided with a first side edge and a second side edge; the first hinge structure 33 is arranged at the first side edge of the hinge plate 312; and the second hinge structure 34 is arranged at the second side edge of the hinge plate 312. The first hinge structures 33 of any two adjacent fan brackets 31 can be in hinge connection to the second hinge structures 34.

In this aspect, as shown in FIG. 5, the first hinge structure 33 includes: a groove 331, arranged in a middle part of the first side edge of the hinge plate 312; and two C-shaped elements 332, arranged on the first side edge of the hinge plate 312 and respectively located above and below the groove 331.

As shown in FIG. 5, the second hinge structure 34 includes: a convex block 342, arranged in a middle part of the second side edge of the hinge plate 312; and two rotating shafts 341, respectively connected above and below the convex block 342.

As shown in FIG. 5, each fan bracket 31 further includes: a barrier plate 313. The barrier plate 313 is perpendicularly connected to the sliding plate 311 and arranged in parallel to the hinge plate 312. Both the barrier plate 313 and the hinge plate 312 are provided with fixing holes 314 configured to fix the fan 4.

In this aspect, as shown in FIG. 3 and FIG. 4, the push-pull frame 5 is provided with a first hinge structure 33 hinged to the second hinge structure 34 on the fan bracket 31 at the corresponding end portion of the chain bracket 3. Or alternatively, the push-pull frame 5 is provided with a second hinge structure 34 hinged to the first hinge structure 33 on the fan bracket 31 at the corresponding end portion of the chain bracket 3.

As shown in FIG. 6, the six fan brackets 31 have identical appearances and are connected to the fans 4 through six screws. Four guiding rail limiting rods 32 are arranged at the bottom, and a distance between the limiting rods 32 is consistent with or increases by about 10% relative to a width of the sliding rail 2 on the bottom plate 11 of the outer fan module frame 1. The groove 331 of the first hinge structure 33 on the left side of each fan bracket 31 and the convex block 342 of the second hinge structure 34 on the right side have the same widths. When two or more fan brackets 31 are connected to each other, the rotating shafts 341 are used to penetrate through the C-shaped elements 332 on the two sides to form an opening and closing structure. When the chain bracket 3 formed by hinging the fan brackets 31 turns, the opening and closing structure provides a degree of freedom of rotation.

Aspect 5

In Aspect 5, a server is provided, including a slidably pluggable multi-fan module. The slidably pluggable multi-fan module has a height of 73.8 mm, and a single fan 4 has an outline dimension of 60 mm×60 mm×56 mm, which is suitable for being placed in a standard 2U server case, or a plurality of slidably pluggable multi-fan modules are combined and placed in a server case of 4U or above. The server is provided with a control chip. The control chip is electrically connected to a fan control panel 6, and the control chip includes a BMC.

As shown in FIG. 2, a slidably pluggable multi-fan module is provided, including: an outer fan module frame 1, a sliding rail 2, a chain bracket 3, a plurality of fans 4, and a push-pull frame 5.

As shown in FIG. 2, FIG. 3, and FIG. 7, the outer fan module frame 1 includes an L-shaped bottom plate 11; the bottom plate 11 is provided with a push-pull guiding region 111 and a fan mounting region 112; the sliding rail 2 is arranged on the bottom plate 11 of the outer fan module frame 1 in an L-shaped manner; the chain bracket 3 is composed of a plurality of fan brackets 31 hinged to each other; a limiting rod 32 matched with the sliding rail 2 is arranged at a bottom of each fan bracket 31 and can slide along the sliding rail 2; a length of the chain bracket 3 is equal to a length of the fan mounting region 112; each fan 4 is correspondingly arranged in one fan bracket 31; one end of the push-pull frame 5 is hinged to a fan bracket 31 at an end portion of the chain bracket 3; and the push-pull frame 5 can push the chain bracket 3 from the push-pull guiding region 111 into the fan mounting region 112 along the sliding rail 2 and then fixes the chain bracket, and can pull the chain bracket 3 out of the fan mounting region 112 along the sliding rail 2 to the push-pull guiding region 111 or to be beyond the sliding rail 2.

As shown in FIG. 7, a main function of the outer fan module frame 1 is supporting and positioning. The bottom plate 11 of the outer fan module frame is correspondingly provided with an L-shaped convex hull structure serving as the sliding rail 2 for the fans 4. In conjunction with the limiting rods 32 at the bottoms of the fan brackets 31, it can ensure that the fans 4 slide along the sliding rail 2 into a case.

Inner sides of connection positions of the push-pull guiding region 111 and the fan mounting region 112 are connected in an arc-shaped smooth transition manner; and portions, corresponding to the connection positions of the push-pull guiding region 111 and the fan mounting region 112, of the sliding rail 2 are arc-shaped. The sliding rail 2 is arranged in a middle part of the bottom plate 11 in the L-shaped manner. Due to this arrangement, it is convenient to push the chain bracket 3 from the push-pull guiding region 111 into the fan mounting region 112 along the sliding rail 2.

In this aspect, a length of the push-pull frame 5 is equal to a length of the push-pull guiding region 111; and the push-pull frame 5 further includes a handle 51 at one end away from the fan brackets 31.

In this aspect, the push-pull frame 5 further includes a stop lock 52 at one end away from the fan brackets 31, and the stop lock 52 can be locked with the outer fan module frame 1.

In an embodiment, as shown in FIG. 2 and FIG. 3, the outer fan module frame 1 further includes an inner side plate 12 perpendicular to the bottom plate 11; a stop slot 121 is provided on the inner side plate 12; and the stop lock 52 can be hooked and locked with the stop slot 121. The stop lock 52 is further provided with an unlock button 53 beyond the inner side plate 12, and the unlock button 53 is arranged above the handle 51.

In this aspect, as shown in FIG. 2, FIG. 3, and FIG. 7, the outer fan module frame 1 further includes an outer side plate 13 perpendicular to the bottom plate 11. The outer side plate 13 is arranged in parallel to the inner side plate 12, and the outer side plate 13 extends from the push-pull guiding region 111 to the fan mounting region 112. The outer side plate 13 is arranged in parallel to the push-pull frame 5.

As shown in FIG. 2 and FIG. 3, the slidably pluggable multi-fan module further includes: a fan control panel 6, arranged on the outer side plate 13 and corresponding to the fan mounting region 112; and a fan management board 7, arranged at an end portion of the push-pull frame 5 adjacent to the fan brackets 31. The fan management board 7 corresponds to the fan control panel 6; and when the chain bracket 3 is fixed in the fan mounting region 112, the fan management board 7 is correspondingly connected to the fan control panel 6.

In this aspect, as shown in FIG. 2 and FIG. 3, the fan control panel 6 is electrically connected to a control chip of a server. The control chip includes a BMC. The fan control panel 6 is electrically connected to the fans 4, and the fan management board 7 is configured to control communication between the fan control panel 6 and the fans 4.

The fan control panel 6 is provided with a terminal 61; the fan management board 7 is provided with a connector 71; the fans 4 are provided with cable connectors 71; and the cable connectors 71 of the fans 4 are plugged into the terminal 61 of the fan control panel 6. When the chain bracket 3 is fixed in the fan mounting region 112, the connector 71 of the fan management board 7 is plugged into the terminal 61 of the fan control panel 6 to receive a signal of the fan management board 7; and the fan control panel 6 sends an in-place signal of the fans 4 to the control chip of the server, otherwise, the fan control panel 6 sends an absence signal of the fans 4 to the control chip of the server.

The cooperation between the fan management board 7 and the fan control panel 6 can achieve conventional control of the fans 4 and determine an in-place state of the fan module. The combined function of the fan control panel 6 and the fan management board 7 include reminding in-place/absence of the fans 4 and controlling the fans 4.

In this aspect, as shown in FIG. 3 and FIG. 5, each fan bracket 31 includes a sliding plate 311, a hinge plate 312, a first hinge structure 33, and a second hinge structure 34. At least two groups of the limiting rods 32 are arranged at a bottom of the sliding plate 311; the hinge plate 312 is perpendicularly connected to the sliding plate 311; the hinge plate 312 is provided with a first side edge and a second side edge; the first hinge structure 33 is arranged at the first side edge of the hinge plate 312; and the second hinge structure 34 is arranged at the second side edge of the hinge plate 312. The first hinge structures 33 of any two adjacent fan brackets 31 can be in hinge connection to the second hinge structures 34.

In this aspect, as shown in FIG. 5, the first hinge structure 33 includes: a groove 331, arranged in a middle part of the first side edge of the hinge plate 312; and two C-shaped elements 332, arranged on the first side edge of the hinge plate 312 and respectively located above and below the groove 331.

As shown in FIG. 5, the second hinge structure 34 includes: a convex block 342, arranged in a middle part of the second side edge of the hinge plate 312; and two rotating shafts 341, respectively connected above and below the convex block 342.

As shown in FIG. 5, each fan bracket 31 further includes: a barrier plate 313. The barrier plate 313 is perpendicularly connected to the sliding plate 311 and arranged in parallel to the hinge plate 312. Both the barrier plate 313 and the hinge plate 312 are provided with fixing holes 314 configured to fix the fan 4.

In this aspect, as shown in FIG. 3 and FIG. 4, the push-pull frame 5 is provided with a first hinge structure 33 hinged to the second hinge structure 34 on the fan bracket 31 at the corresponding end portion of the chain bracket 3. Or alternatively, the push-pull frame 5 is provided with a second hinge structure 34 hinged to the first hinge structure 33 on the fan bracket 31 at the corresponding end portion of the chain bracket 3.

The outer fan module frame 1 in the above slidably pluggable multi-fan module supports front panel maintenance, namely, a module in which a plurality of fans 4 are integrated is directly plugged into a middle arrangement position for the fans 4 of a case from a front panel; the chain bracket 3 forms an opening and closing structure in the form of a chain; and the bottom of the chain bracket cooperates with the sliding rail 2 to achieve the design of a movement trajectory of the fans 4.

As shown in FIG. 6, the six fan brackets 31 have identical appearances and are connected to the fans 4 through six screws. Four guiding rail limiting rods 32 are arranged at the bottom, and a distance between the limiting rods 32 is consistent with or increases by about 10% relative to a width of the sliding rail 2 on the bottom plate 11 of the outer fan module frame 1. The groove 331 of the first hinge structure 33 on the left side of each fan bracket 31 and the convex block 342 of the second hinge structure 34 on the right side have the same widths. When two or more fan brackets 31 are connected to each other, the rotating shafts 341 are used to penetrate through the C-shaped elements 332 on the two sides to form an opening and closing structure. When the chain bracket 3 formed by hinging the fan brackets 31 turns, the opening and closing structure provides a degree of freedom of rotation.

The detailed limitations on the server can be found in the limitations on the slidably pluggable multi-fan module described above, and will not be elaborated here.

All the technical features of the above embodiments can be combined randomly. For the sake of brevity, all possible combinations of all the technical features in the above embodiments are not described. However, these technical features shall all be considered to fall within the scope of this specification as long as there is no contradiction in their combinations.

The foregoing embodiments merely express several implementations of the present application. The descriptions thereof are relatively concrete and detailed, but are not understood as limitations on the scope of the disclosure. A person of ordinary skill in the art can also make several modifications and improvements without departing from the idea of the present application. These modifications and improvements fall within the protection scope of the present application. Therefore, the protection scope of the present application shall be subject to the appended claims.

What is claimed is:

1. A slidably pluggable multi-fan module, comprising:
an outer frame, comprising an L-shaped bottom plate with a push-pull guiding region and a fan mounting region arranged thereon, wherein an extension direction of the push-pull guiding region and an extension direction of the fan mounting region are perpendicularly arranged;
a sliding rail, arranged on the L-shaped bottom plate, wherein the sliding rail is arranged in a middle part of the L-shaped bottom plate in an L-shaped manner;
a chain bracket, composed of a plurality of fan brackets hinged to each other, wherein each of the plurality of fan brackets comprises a sliding plate with limiting rods arranged at a bottom thereof, a hinge plate perpendicularly connected to the sliding plate and a barrier plate perpendicularly connected to the sliding plate and arranged in parallel to the hinge plate, wherein the limiting rods match with the sliding rail and are slidable along the sliding rail, and the hinge plate of each of the plurality of fan brackets is hinged to the hinge plate of an adjacent fan bracket of the plurality of fan brackets;
a plurality of fans, wherein each of the plurality of fans is correspondingly arranged in a corresponding one of the plurality of fan brackets and fixed to the barrier plate and the hinge plate; and
a push-pull frame, wherein a first end of the push-pull frame is hinged to one of the plurality of fan brackets at an end portion of the chain bracket; and the push-pull frame pushes the chain bracket from the push-pull guiding region into the fan mounting region along the sliding rail and then fixes the chain bracket, and pulls the chain bracket out of the fan mounting region along the sliding rail to the push-pull guiding region or to be beyond the sliding rail.

2. The slidably pluggable multi-fan module according to claim 1, wherein inner sides of connection positions of the push-pull guiding region and the fan mounting region are connected in an arc-shaped smooth transition manner; and portions, corresponding to the connection positions of the push-pull guiding region and the fan mounting region, of the sliding rail are arc-shaped.

3. The slidably pluggable multi-fan module according to claim 1, wherein:
the hinge plate is provided with a first side edge and a second side edge; and each of the plurality of fan brackets further comprises:
a first hinge structure, arranged at the first side edge of the hinge plate; and
a second hinge structure, arranged at the second side edge of the hinge plate, wherein the first hinge structures of any two adjacent fan brackets of the plurality of fan brackets are in hinge connection to the second hinge structures.

4. The slidably pluggable multi-fan module according to claim 3, wherein the first hinge structure comprises:
a groove, arranged in a middle part of the first side edge of the hinge plate; and
two C-shaped elements, arranged on the first side edge of the hinge plate and respectively located above and below the groove.

5. The slidably pluggable multi-fan module according to claim 4, wherein the second hinge structure comprises:
a convex block, arranged in a middle part of the second side edge of the hinge plate; and
two rotating shafts, respectively connected above and below the convex block.

6. The slidably pluggable multi-fan module according to claim 5, wherein the push-pull frame is provided with a third hinge structure hinged to the second hinge structure on the fan bracket at the end portion of the chain bracket.

7. The slidably pluggable multi-fan module according to claim 5, wherein the push-pull frame is provided with a fourth hinge structure hinged to the first hinge structure on the fan bracket at the end portion of the chain bracket.

8. The slidably pluggable multi-fan module according to claim 3, wherein:
both the barrier plate and the hinge plate are provided with fixing holes configured to fix a corresponding one of the plurality of fans.

9. The slidably pluggable multi-fan module according to claim 1, wherein the outer frame further comprises an outer side plate perpendicular to the L-shaped bottom plate; the outer side plate extends from the push-pull guiding region to the fan mounting region; and the outer side plate is arranged in parallel to the push-pull frame.

10. The slidably pluggable multi-fan module according to claim 9, further comprising:
   a fan control panel, arranged on the outer side plate and corresponding to the fan mounting region; and
   a fan management board, arranged at an end portion of the push-pull frame adjacent to the plurality of fan brackets, wherein the fan management board corresponds to the fan control panel; and under a circumstance that the chain bracket is fixed in the fan mounting region, the fan management board is correspondingly connected to the fan control panel.

11. The slidably pluggable multi-fan module according to claim 10, wherein the fan control panel is provided with a terminal; the fan management board is provided with a connector; the plurality of fans are provided with cable connectors; and the cable connectors of the plurality of fans are plugged into the terminal of the fan control panel.

12. The slidably pluggable multi-fan module according to claim 11, wherein when the chain bracket is fixed in the fan mounting region, the connector of the fan management board is plugged into the terminal of the fan control panel to receive a signal of the fan management board.

13. The slidably pluggable multi-fan module according to claim 1, wherein a length of the push-pull frame is equal to a length of the push-pull guiding region; and the push-pull frame further comprises a handle at one end away from the plurality of fan brackets.

14. The slidably pluggable multi-fan module according to claim 13, wherein the push-pull frame further comprises a stop lock at the one end away from the plurality of fan brackets, and the stop lock is locked with the outer frame.

15. The slidably pluggable multi-fan module according to claim 14, wherein the outer frame further comprises an inner side plate perpendicular to the L-shaped bottom plate; a stop slot is provided on the inner side plate; and the stop lock is hooked and locked with the stop slot.

16. The slidably pluggable multi-fan module according to claim 15, wherein the stop lock is further provided with an unlock button beyond the inner side plate, and the unlock button is arranged above the handle.

17. A server, comprising a slidably pluggable multi-fan module, wherein the slidably pluggable multi-fan module comprises:
   an outer frame, comprising an L-shaped bottom plate with a push-pull guiding region and a fan mounting region arranged thereon, wherein an extension direction of the push-pull guiding region and an extension direction of the fan mounting region are perpendicularly arranged;
   a sliding rail, arranged on the L-shaped bottom plate, wherein the sliding rail is arranged in a middle part of the L-shaped bottom plate in an L-shaped manner;
   a chain bracket, composed of a plurality of fan brackets hinged to each other, wherein each of the plurality of fan brackets comprises a sliding plate with limiting rods arranged at a bottom thereof, a hinge plate perpendicularly connected to the sliding plate and a barrier plate perpendicularly connected to the sliding plate and arranged in parallel to the hinge plate, wherein the limiting rods match with the sliding rail and are slidable along the sliding rail, and the hinge plate of each of the plurality of fan brackets is hinged to the hinge plate of an adjacent fan bracket of the plurality of fan brackets;
   a plurality of fans, wherein each of the plurality of fans is correspondingly arranged in a corresponding one of the plurality of fan brackets and fixed to the barrier plate and the hinge plate; and
   a push-pull frame, wherein a first end of the push-pull frame is hinged to one of the plurality of fan brackets at an end portion of the chain bracket; and the push-pull frame pushes the chain bracket from the push-pull guiding region into the fan mounting region along the sliding rail and then fixes the chain bracket, and pulls the chain bracket out of the fan mounting region along the sliding rail to the push-pull guiding region or to be beyond the sliding rail.

\* \* \* \* \*